(12) United States Patent
Shim et al.

(10) Patent No.: US 6,489,667 B1
(45) Date of Patent: Dec. 3, 2002

(54) SEMICONDUCTOR DEVICE AND METHOD OF MANUFACTURING SUCH DEVICE

(75) Inventors: Il Kwon Shim, Singapore (SG); Chang Kyu Park, KyungKi-Do (KR); Byung Joon Han, Singapore (SG); Vincent DiCaprio, Mesa, AZ (US); Paul Hoffman, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/422,115

(22) Filed: Oct. 20, 1999

(30) Foreign Application Priority Data

Oct. 31, 1998 (KR) .......................... 98-465572
Oct. 31, 1998 (KR) .......................... 98-465666

(51) Int. Cl.$^7$ .......................................... H01L 23/495
(52) U.S. Cl. ............... 257/668; 257/781; 257/778; 257/650; 257/692; 257/784; 257/701; 257/780; 257/787
(58) Field of Search ................ 257/668, 781, 257/778, 650, 692, 784, 701, 780, 787

(56) References Cited

U.S. PATENT DOCUMENTS

| | | | |
|---|---|---|---|
| 5,148,265 A | 9/1992 | Khandros et al. | 357/80 |
| 5,258,330 A | 11/1993 | Khandros et al. | 437/209 |
| 5,384,689 A | 1/1995 | Shen | 361/761 |
| 5,477,611 A | 12/1995 | Sweis et al. | 29/840 |
| 5,519,936 A | 5/1996 | Andros et al. | 29/840 |
| 5,536,909 A | 7/1996 | DiStefano et al. | 174/261 |
| 5,633,785 A | 5/1997 | Parker et al. | 361/766 |
| 5,684,330 A | 11/1997 | Lee | 257/692 |
| 5,753,974 A | 5/1998 | Masukawa | 257/737 |
| 5,858,815 A | 1/1999 | Heo et al. | 438/112 |
| 5,866,949 A | 2/1999 | Schueller | 257/778 |
| 5,950,707 A | 9/1999 | Razon et al. | 438/113 |
| 5,989,982 A | 11/1999 | Yoshihazu | 438/462 |
| 5,990,545 A | 11/1999 | Schueller et al. | 257/697 |
| 6,028,354 A | 2/2000 | Hoffman | 257/706 |
| 6,043,109 A | 5/2000 | Yang et al. | 438/113 |
| 6,144,102 A * | 11/2000 | Amagai | 257/781 |
| 6,252,298 B1 * | 6/2001 | Lee et al. | 257/668 |

* cited by examiner

Primary Examiner—David L. Talbott
Assistant Examiner—Luan Thai

(57) ABSTRACT

Semiconductor devices and methods of manufacturing such devices are disclosed. In one embodiment of this invention, a semiconductor chip is bonded to a first surface of a substrate. The substrate extends beyond the edge of the chip. Signal input/output pads on the chip are juxtaposed with an opening in the substrate. A molded support is formed on the portion of the first surface of the substrate that extends beyond between the sidewall of the edge of the chip. The support prevents bending of the substrate, and allows solder balls to be formed on the entire area of a second surface of the substrate opposite the first surface of the substrate. A heat dissipating plate is mounted on a surface of the chip opposite the substrate. The heat dissipating plate is attached to the support.

18 Claims, 7 Drawing Sheets

SEMICONDUCTOR DEVICE AND METHOD OF MANUFACTURING SUCH DEVICE

CROSS-REFERENCE TO RELATED APPLICATION

This application is related to an application entitled "Chip-Scale Semiconductor Package Of The Fan-Out Type And Method Of Manufacturing Such Packages" (application Ser. No. 09/422027), which was filed with the U.S. Patent and Trademark Office on the same day as the present application and is incorporated by reference herein.

FIELD OF THE INVENTION

The present invention relates, in general, to semiconductor devices and a method of manufacturing such devices and, more particularly, to a semiconductor device having a substrate on one surface of a semiconductor chip, the substrate extending on the chip so as to exceed the outside edge of the chip, thus carrying an increased number of solder balls or signal input/output terminals on the device and being almost free from being bent, and effectively dissipating heat from the chip to the atmosphere, the invention also relating to a method of manufacturing such a semiconductor device.

DESCRIPTION OF THE PRIOR ART

As is well known to those skilled in the art, a semiconductor device is used for mounting a semiconductor chip on a mother board in addition to intermediating input/output signals between the chip and the mother board. In accordance with the recent trend of compactness, lightness, thinness and smallness of semiconductor chips, it has been necessary to make the semiconductor device compact, light, thin and small.

FIG. 1 shows a conventional semiconductor device 100'. In the drawing, the semiconductor device 100' is shown while being inverted for ease of description.

As shown in the drawing, the conventional semiconductor device 100' comprises a semiconductor chip 40', having a plurality of signal input/output pads or edge pads 41' on its upper edge. A substrate 10' is formed on the upper surface of chip 40 as follows. A polyimide layer 12' is attached to the upper surface of the chip 40' with an adhesive layer 21' being interposed between the chip 40' and the polyimide layer 12'. The above substrate 10' also comprises a plurality of circuit patterns formed on the polyimide layer 12'. Each of the circuit patterns consists of a solder ball land 15'. A connector 14' extends from the solder ball land 15' and has a lead 13' at its outside end, and is connected to an associated signal input/output pad 41' of the chip 40' at the lead 13' using an electric connecting means 50'. A cover coat 16' is coated on both the connectors 14' of the above circuit patterns and the upper surface of the polyimide layer 12'. In order to protect the pads 41' of the chip 40', the electric connecting means 50' and the leads 13' from the atmospheric environment, the upper edge of the chip 40' is packaged using a packaging material, thus forming a packaging part 60'. A solder ball 70' is welded to each of the solder ball lands 15' and is used for mounting the semiconductor device 100' on a mother board.

Such semiconductor devices 100' may be produced as follows. In a first conventional process, a plurality of semiconductor chips are primarily attached to the lower surface of a wafer-shaped substrate using an adhesive layer, thus performing a wafer lamination step. Thereafter, an electric connection step is performed. In the electric connection step, each signal input/output pad of each of the semiconductor chips is connected to an associated lead of the circuit patterns of the substrate using an electric connecting means. The electric connection step is followed by a packaging step wherein the upper edge of each of the semiconductor chips is covered with a packaging part so as to protect the electric connection part, comprising the signal input/output pads, the electric connecting means and the leads, from the atmospheric environment. Thereafter, a solder ball welding step, wherein a plurality of solder balls are welded to the solder ball lands of the substrate, is performed. A singulation step follows the solder ball welding step. In the singulation step, the wafer, with the substrate, is divided into a plurality of semiconductor devices.

Alternatively, the semiconductor devices may be produced through a second process. In the second process, a plurality of semiconductor chips are bonded to a rectangular or regular square substrate strip prior to performing the same electric connection step, packaging step, solder ball welding step and singulation step as that described for the first process.

In recent years, it is necessary to carry an increased number of signal input/output pads on a semiconductor chip in accordance with a development in the semiconductor chip integration technology. Therefore, it is also necessary to increase the number of solder balls formed on each semiconductor device. However, since the conventional substrate is formed on a limited area of one surface of a semiconductor chip as described above, the area of the substrate is smaller than that of the chip. This limits both the number of circuit patterns and the number of solder balls formed on each substrate.

In order to overcome the above-mentioned problems, the substrate may extend in a way such that it exceeds the outside edge of the chip. However, since the substrate is made of a flexible material, the enlarged substrate is partially and easily bent at a portion outside the edge of the chip. When a solder ball is carried on the portion of the substrate outside the edge of the chip, the substrate regrettably fails to firmly or effectively support the solder ball on that portion.

Another problem, experienced in the conventional semiconductor device, resides in that the device fails to effectively dissipate heat from the semiconductor chip into the atmosphere during an operation of the device. That is, in accordance with the recent trend of high integration degree and high operational frequency of semiconductor chips, each semiconductor chip emits a large quantity of heat during an operation of the device. However, the conventional semiconductor device does not have any structure designed to effectively dissipate the heat to the atmosphere, thus being reduced in its electric performance and causing an operational error of the chip.

SUMMARY OF THE INVENTION

Accordingly, the present invention has been made keeping in mind the above problems occurring in the prior art, and an object of the present invention is to provide a semiconductor device, of which the substrate extends on one surface of a semiconductor chip so as to exceed the outside edge of the chip and has an area larger than that of the chip, thus effectively carrying an increased number of circuit patterns and solder balls or signal input/output terminals on the device.

Another object of the present invention is to provide a semiconductor device, of which the electric connection part, comprising the bond fingers of the substrate and the signal input/output pads of the chip, is primarily packaged with a packaging material, thus being prevented from unexpected separation during a process of manufacturing the device, and which is secondarily packaged with a packaging material so as to enhance the bonding strength between the chip and the substrate, thus preventing an undesirable bending of the substrate and firmly supporting the solder balls carried on the substrate, and increasing the bonding strength at the junction between the parts of the device.

A further object of the present invention is to provide a semiconductor device which more effectively and quickly dissipates heat from the semiconductor chip into the atmosphere, thus being almost free from a reduction in its electric performance and being almost free from any operational error of the chip.

Still another of the present invention is to provide a method of manufacturing the above-mentioned semiconductor device.

In order to accomplish the above objects, an embodiment of the present invention provides a semiconductor device, comprising: a semiconductor chip having a plurality of signal input/output pads on one surface thereof; a substrate having a plurality of regularly arranged circuit patterns and an area larger than that of the semiconductor chip, each of the circuit patterns consisting of a solder ball land and a bond finger extending from the solder ball land, with a cover coat covering the circuit patterns except for an area corresponding to both the solder ball lands and the bond fingers, the substrate also having a hole at a position around the bond fingers; an adhesive layer adapted for bonding the substrate to the semiconductor chip with the signal input/output pads being exposed to an outside of the substrate through the hole of the substrate; electric connection means for electrically connecting each of the bond fingers of the substrate to an associated signal input/output pad of the chip, the electric connection means passing through the hole of the substrate; a primary packaging part adapted for packaging both the electric connection means and the signal input/output pads positioned inside the hole of the substrate; a second packaging part adapted for packaging an, area defined between a sidewall of the semiconductor chip and the substrate; and a solder ball welded to each of the solder ball lands provided on the substrate.

In the above semiconductor device, a polyimide layer may be formed between the adhesive layer and the circuit patterns.

In addition, a metal core layer may be formed between the polyimide layer and the adhesive layer.

The primary packaging part is preferably made of a liquid packaging material, while the second packaging part is preferably made of an epoxy molding compound.

In the present invention, the sidewall of the second packaging part may be aligned with the edge of the substrate.

The sidewall of the second packaging part may be positioned inside the edge of the substrate.

The sidewall of the second packaging part may be parallel to the sidewall of the semiconductor chip, or may be inclined downwardly relative to the sidewall of the semiconductor chip at an acute angle.

The surface of the semiconductor chip opposite to the surface having the signal input/output pads may be leveled with the surface of the second packaging part opposite to the substrate contact surface of the second packaging part.

In addition, a heat dissipating plate may be attached to the surface of the semiconductor chip opposite to the surface having the signal input/output pads.

The sidewall of the heat dissipating plate is covered with the second packaging part.

The surface of the heat dissipating plate opposite to a chip contact surface of the plate is leveled with the surface of the second packaging part opposite to the substrate contact surface of the second packaging part.

The electric connection means is preferably selected from a conductive wire and a lead.

In an embodiment of present invention, the circuit patterns comprise: a plurality of first circuit patterns formed on the substrate at a position corresponding to the surface of the semiconductor chip; and a plurality of second circuit patterns formed on the substrate at a position outside the edge of the semiconductor chip, with the hole being formed between the first and second circuit patterns while separating the first and second circuit patterns from each other.

The first packaging part may pass through the hole of the substrate prior to being brought into contact with the second packaging part.

The second packaging part may package an area defined between the second circuit patterns and the sidewall of the semiconductor package, thus supporting the substrate having the second circuit patterns thereon.

The signal input/output pads are arranged along opposite edges of the semiconductor chip.

An embodiment of present invention also provides a method of manufacturing a semiconductor device, comprising the steps of: preparing a substrate having upper and lower surfaces and a plurality of regularly arranged circuit patterns, each of the circuit patterns having upper and lower surfaces and consisting of a solder ball land and a bond finger extending from the solder ball land, with a cover coat covering the circuit patterns except for an area corresponding to both the solder ball lands and the bond fingers, the substrate also having a hole at a position around the bond fingers; bonding a semiconductor chip, having both an area not larger than of the substrate and a plurality of signal input/output pads, to the substrate using an adhesive layer in a way such that the signal input/output pads are exposed to an outside of the substrate through the hole of the substrate; electrically connecting each of the circuit patterns of the substrate to an associated signal input/output pad of the chip using an electric connection means passing through the hole of the substrate; primarily packaging both the electric connection means and the signal input/output pads positioned inside the hole of the substrate, thus forming a primary packaging part; secondarily packaging an area defined between a sidewall of the semiconductor chip and a lower surface of the substrate, thus forming a second packaging part; and welding a solder ball to each of the solder ball lands provided on the substrate.

In the above method, the substrate may further comprise a polyimide layer formed on the lower surface of the circuit patterns.

The above polyimide layer may be formed on a metal core layer.

An embodiment of the circuit patterns comprise: a plurality of first circuit patterns formed on the substrate at a position corresponding to the surface of the semiconductor chip; and a plurality of second circuit patterns formed on the substrate at a position outside the edge of the semiconductor chip, with the hole being formed between the first and second circuit patterns.

The second packaging part allows the lower surface of the semiconductor chip to be exposed to the atmosphere.

In the above method, the second packaging step may be performed with a heat dissipating plate being positioned on a lower surface of the semiconductor chip.

The first and second packaging steps may be performed while allowing the first packaging part to be brought into contact with the second packaging part.

The second packaging step may be performed so as to allow the second packaging part to package the area defined between the second circuit patterns and the sidewall of the semiconductor package, thus supporting the substrate having the second circuit patterns thereon.

In the above method, the electric connection means may be selected from a conductive wire and a lead.

In accordance with an embodiment of the present invention, the substrate, having an area larger than that of a semiconductor chip, is bonded to one surface of the chip and extends so as to exceed the edge of the chip, thus carrying an increased number of circuit patterns and an increased number of solder balls.

In addition, a second packaging part is formed on an area defined between the sidewall of the semiconductor chip and the lower surface of the substrate exceeding the edge of the chip. The portion of the substrate, exceeding the edge of the chip, is thus firmly supported by the second packaging part and is prevented from being bent. The second packaging part also firmly supports the solder balls welded to the upper surface of the substrate.

The semiconductor device of this invention is also designed to dissipate heat from the semiconductor chip into the atmosphere through the lower surface of the chip or through a heat dissipating plate mounted to the lower surface of the chip. Therefore, the semiconductor device is almost completely free from a reduction in the electric performance of the chip or an operational error of the chip during an operation.

BRIEF DESCRIPTION OF THE DRAWINGS

The above and other objects, features and other advantages of the present invention will be more clearly understood. from the following detailed description taken in conjunction with the accompanying drawings, in which.

DESCRIPTION OF THE PREFERRED EMBODIMENTS

Figure 1:
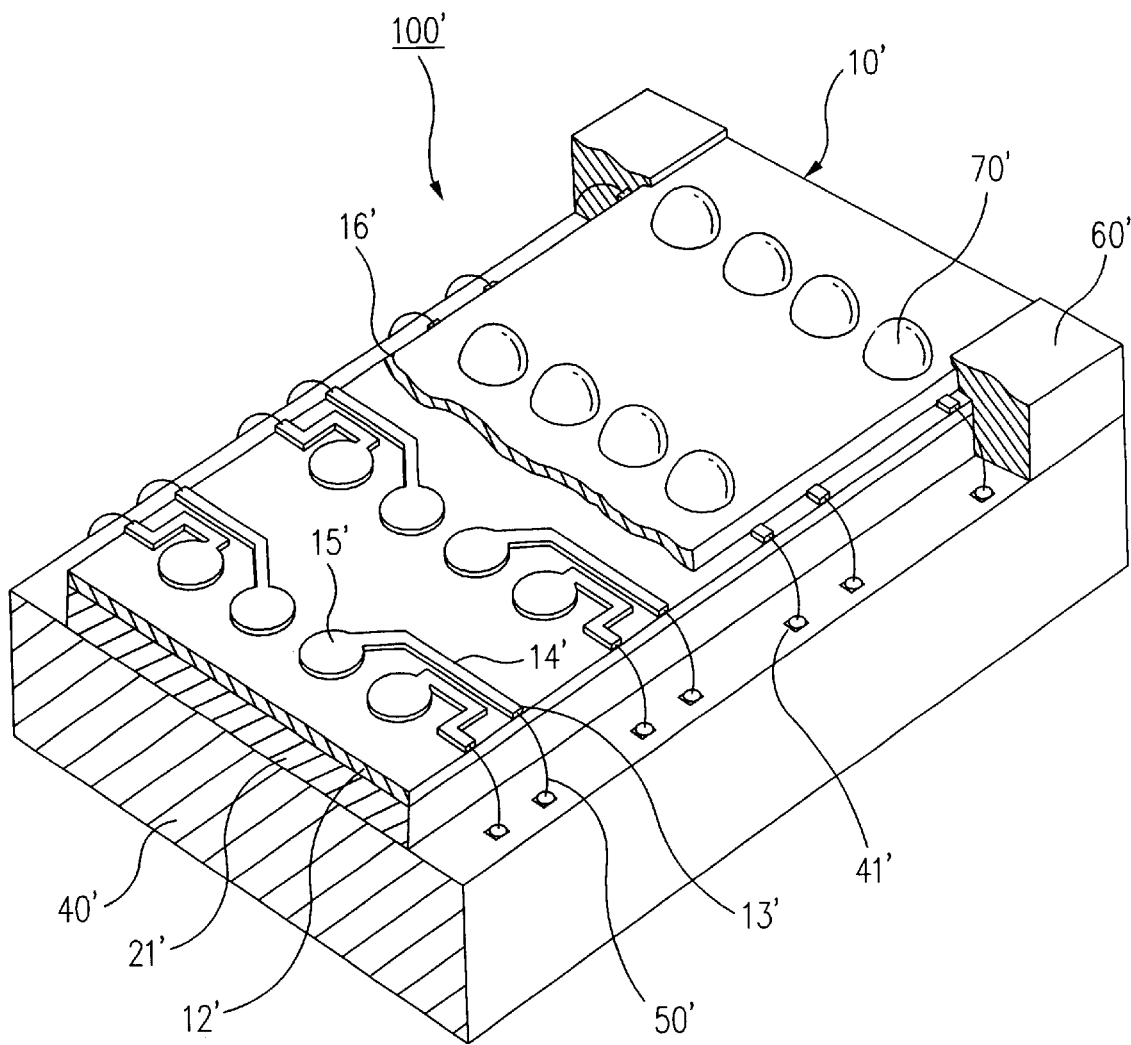
FIG. 1 is a partially broken perspective view, showing the construction of a conventional semiconductor device.

FIGS. 2a to 2d show semiconductor devices 201, 202, 203 and 204 in accordance with four different examples of the primary embodiment of this invention.

As shown in the drawings, any one of the semiconductor devices according to the primary embodiment comprises a semiconductor chip 40. The above chip 40 has a plurality of signal input/output pads or center pads 41 on the central portion of one surface or the upper surface thereof. An adhesive layer 21 is provided on the pad-carrying surface or the upper surface of the chip 40, with one or more first holes 22 being formed on the layer 21 at positions corresponding to the pads 41. In the present invention, it is preferable to use a double-faced adhesive tape or an epoxy adhesive material as the layer 21.

A substrate 10 is attached to the upper surface of the adhesive layer 21. The above substrate 10 extends on the chip 40 until it exceeds the outside edge of the chip 40.

In a detailed description, the substrate 10 has one or more second holes 17 at positions corresponding to the first holes 22 of the adhesive layer 21 or the signal input/output pads 41 of the chip 40. A plurality of circuit patterns are formed on the substrate 10 at a position outside the second holes 17 in a way such that the patterns are positioned on an area including both the semiconductor chip 40 and the portion of the substrate 10 exceeding the outside edge of the chip 40. The circuit patterns individually comprise a bond finger 13, a connector 14 and a solder ball land 15, which are preferably made of a conductive material, such as copper (Cu). In addition, both a bond finger opening area 19 and a solder ball land opening area 18 are formed on each of the circuit patterns. The circuit patterns are also coated with a cover coat 16, thus being protected from the atmospheric environment, such as dust, moisture and mechanical impact.

The bond fingers 13 free from the cover coat 16 may be preferably plated with gold (Au) or silver (Ag) capable of accomplishing an effective electric connection between each bond finger 13 and an electric connecting means 50. In the same manner, the solder ball lands 15 may be preferably plated with gold (Au), silver (Ag), nickel (Ni) or palladium (Pd) capable of allowing a solder ball 80 to be effectively and firmly welded to each solder ball land 15.

In the present invention, it is preferable to form the first and second holes 22 and 17 on the adhesive layer 21 and the substrate 10 through a punching, etching or lasing process.

Of course, it should be understood that the layer structure of the substrate 10 may be changed into a variety of types without affecting the functioning of this invention.

Figure 4A:
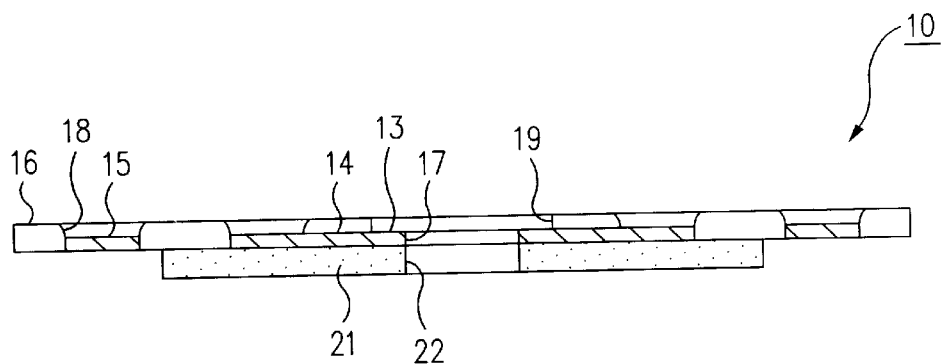
FIGS. 4a to 4c are sectional views, showing the layer structure of substrates according to three different embodiments of this invention.
Figure 4B:
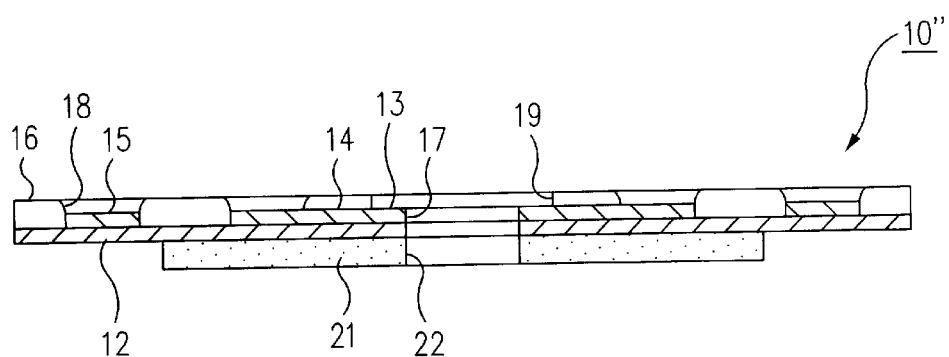
Figure 4C:
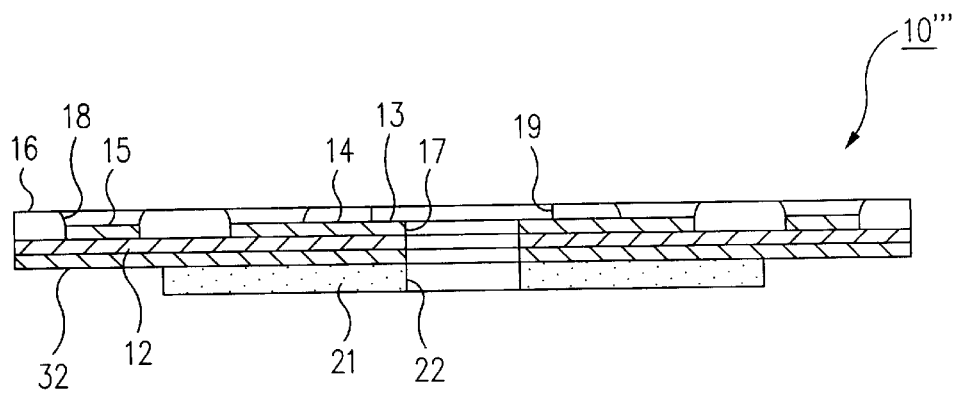

That is, the substrate 10 of this invention may have one or another of the layer structures shown in FIGS. 4a to 4c. It should be noted that the layer structures of FIGS. 4a to 4c may be adapted to the semiconductor devices according to the second embodiment of this invention, which will be described later herein, in addition to the devices according to the primary embodiment of this invention. The layer structure of the substrate 10 shown in FIG. 4a remains the same as that described for the primary embodiment and further explanation is thus not deemed necessary. In accordance with another embodiment of this invention, the substrate may further comprise a polyimide layer 12 as shown in FIG. 4b. That is, in the substrate 10" according to the embodiment of FIG. 4b, a plurality of circuit patterns, individually comprising a bond finger 13, a connector 14 and a solder ball land 15, are formed on a polyimide layer 12 made of a flexible material. A cover coat 16 is coated on both the polyimide layer 12 and the circuit patterns. In the substrate 10''', according to the embodiment of FIG. 4c, a polyimide layer 12 is formed on a core layer 32 made of a hard material. In the same manner as that described for the embodiment of FIG. 4b, a plurality of circuit patterns, individually comprising a bond finger 13, a connector 14 and a solder ball land 15, are formed on the polyimide layer 12. A cover coat 16 is coated on both the polyimide layer 12 and the circuit patterns. In the embodiment of FIG. 4c, the objective of the core layer 32 is to allow the substrate 10''' to have a desired stiffness capable of resisting a bending. In the present invention, it. is preferable to make the core layer 32 using pre-preg, thermosetting plastic, or metal. Of the above-mentioned materials of the core layer 32, the pre-preg has been typically used as the material of a printed circuit board. In the drawings, the reference numeral 21 denotes an adhesive layer used for bonding a substrate 10, 10'', or 10''' to one surface of a semiconductor chip 40.

Returning to FIGS. 2a to 2d, the signal input/output pads 41 of the chip 40 are electrically connected to the bond fingers 13 of the substrate 10 using an electric connecting means 50 passing through the second holes 17 of the substrate 10. Therefore, during an operation of the semiconductor device, the signals from the chip 40 pass through the pads 41, the electric connecting means 50, the bond fingers 13, and the connectors 14 in order, prior to being transmitted to the solder ball lands 15. In the present invention, it is preferable to use a conductive wire, such as a gold wire or an aluminum wire, or a lead as the electric connecting means 50. In such a case, the lead, used as the electric connecting means 50, is formed by the bond finger 13 of each circuit pattern, which extends until it reaches and is electrically connected to an associated signal input/output pad 41 of the chip 40.

A primary packaging part 60 is formed on the electric connection part, comprising the connecting means 50 and the signal input/output pads 41, in the second holes 17 of the substrate 10, thus protecting the electric connection part from the atmospheric environment.

In addition to the primary packaging part 60, a second packaging part 61 is formed on an area defined between the sidewall of the chip 40 and the lower surface of the portion of the substrate 10 extending outside the edge of the chip 40. Therefore, the portion of the substrate 10, extending outside the edge of the chip 40, is supported by the second packaging part 61, thus being prevented from being bent.

In the present invention, it is preferable to form the primary packaging part 60 using a liquid encapsulant packaging material, and the second packaging part 61 using an epoxy molding compound. That is, the primary packaging part 60 is preferably formed by dispensing a liquid packaging material on the second holes 17 of the substrate 10 using a dispenser filled with the liquid packaging material. On the other hand, the second packaging part 61 is preferably formed by injecting high pressure and high temperature epoxy molding compound to a desired area of a semiconductor device held in an injection mold.

Figure 2A:
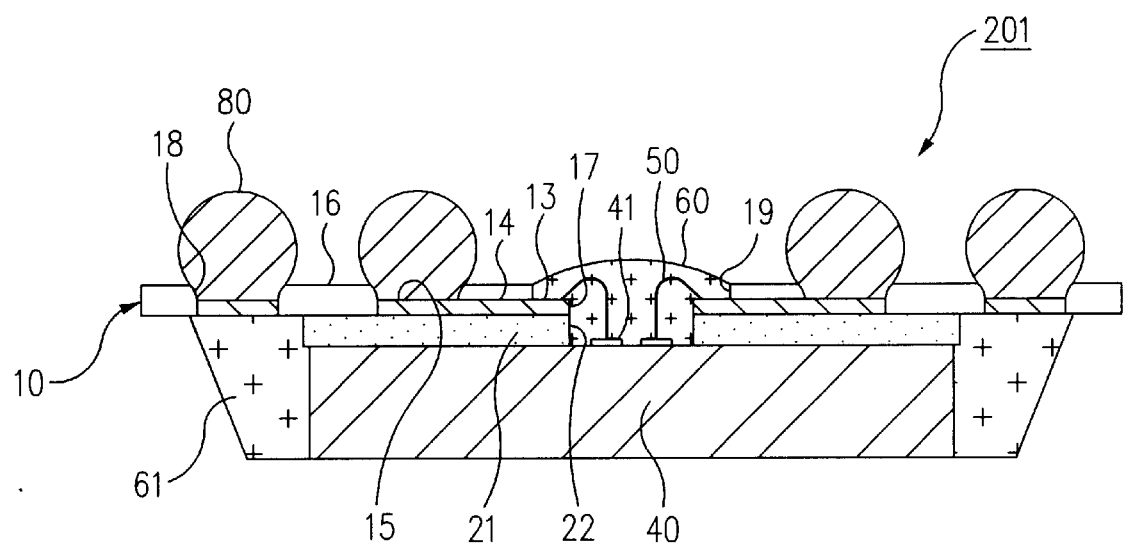
FIGS. 2a to 2d are sectional views, respectively showing semiconductor devices in accordance with four different examples of the primary embodiment of this invention.
Figure 2B:
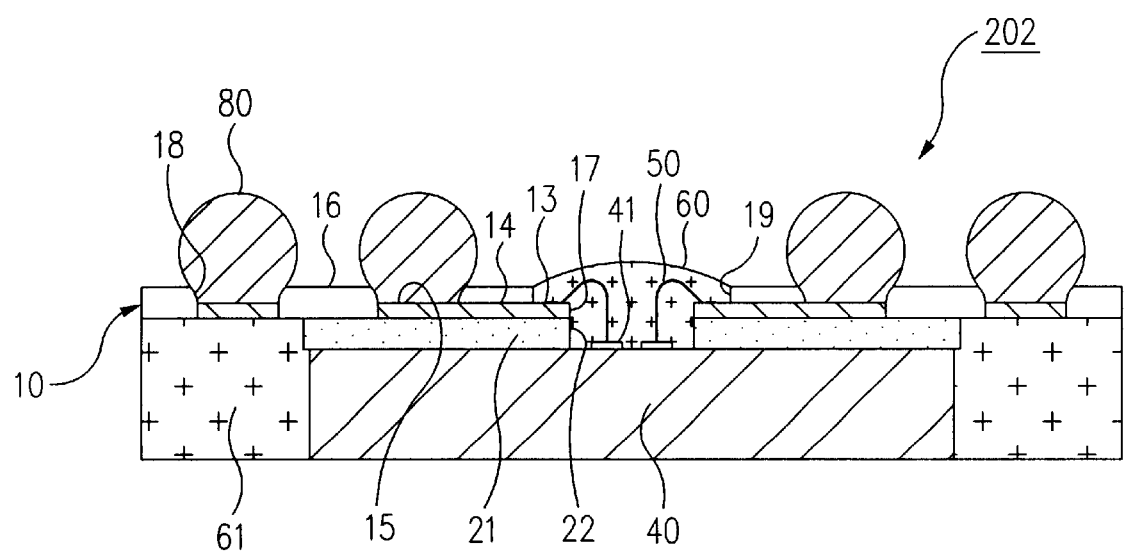
Figure 2C:
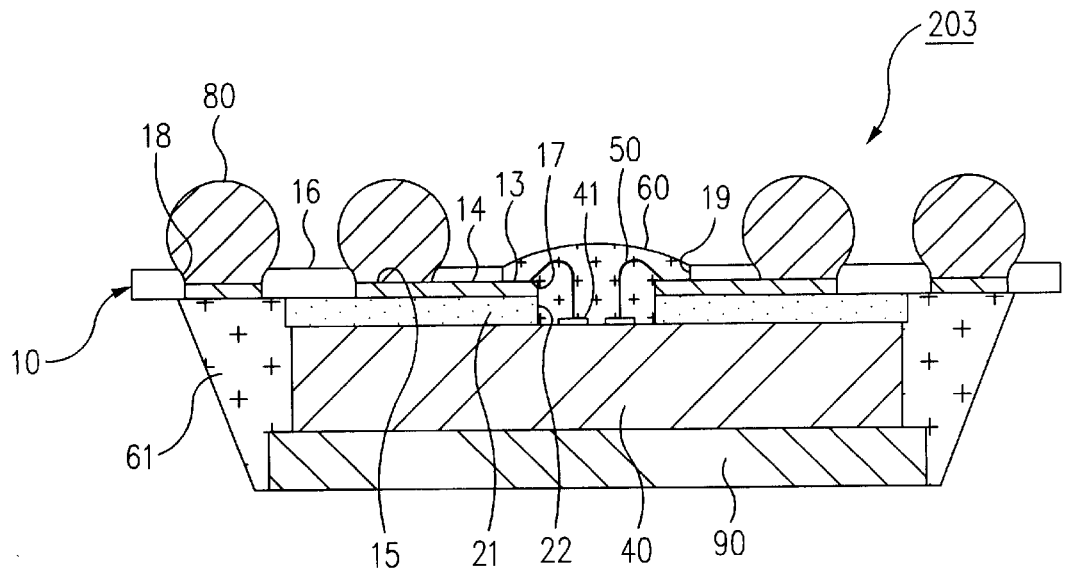
Figure 2D:
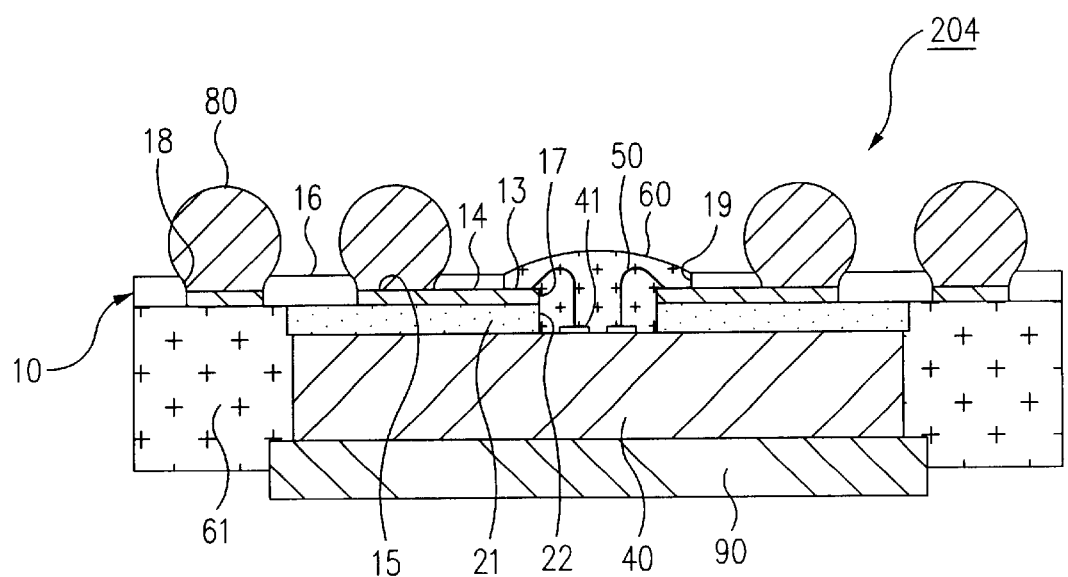

In the present invention, the sidewall of the second packaging part 61 may be positioned inside the edge of the substrate 10, extending outside the edge of the chip 40, as shown in FIGS. 2a and 2c. In such a case, the sidewall of the second packaging part 61 may extend while being inclined downwardly relative to the sidewall of the chip 40 at an acute angle. Alternatively, the sidewall of the second packaging part 61 may be positioned to be aligned with the edge of the substrate 10, extending outside the edge of the chip 40, as shown in FIGS. 2b and 2d. In such a case, the sidewall of the second packaging part 61 may extend in parallel to the sidewall of the chip 40. Of course, it should be understood that the shape of the second packaging part 61 may be somewhat freely changed from the above-mentioned shapes without affecting the functioning of this invention. This is well known to those skilled in the art.

In addition, the lower surface of the chip 40, or the surface opposite to the pad carrying surface of the chip 40, may be preferably leveled with the lower surface of the second packaging part 61, or the surface opposite to the substrate contact surface of the part 61. In such a case, the lower surface of the chip 40 is totally exposed to the atmosphere, thus allowing the chip 40 to more effectively and quickly dissipate heat into the atmosphere. That is, the above-mentioned structure improves the heat dissipating effect of the semiconductor device.

In order to further improve the heat dissipating effect of the semiconductor device, a heat dissipating plate 90 may be attached to the lower surface of the chip 40, or the surface opposite to the pad carrying surface of the chip 40, as shown in FIGS. 2c and 2d.

In such a case, it is preferable to cover the sidewall of the heat dissipating plate 90 with the second packaging part 61 so as to allow the plate 90 to be firmly interlocked by the second packaging part 61. On the other hand, the lower surface of the heat dissipating plate 90, or the surface opposite to the chip contact surface of the plate 90, may be preferably leveled with the lower surface of the second packaging part 61, or the surface opposite to the substrate contact surface of the part 61. However, it should be understood that the structure of the heat dissipating plate 90 may be somewhat freely changed from the above-mentioned structure without affecting the functioning of this invention. This is well known to those skilled in the art.

In the present invention, the heat dissipating plate 90 may be preferably made of a high thermal conductive material, more preferably, made of copper (Cu), aluminum (Al), or an alloy of copper and aluminum.

The solder ball lands 15, positioned within the solder ball land opening area 18 of the substrate 10, are signal input/output terminals used for mounting the semiconductor device on a mother board in addition to transmitting input/output signals between the chip 40 and the mother board. A spherical solder ball 80, made of tin (Sn), lead (Pb), or an alloy of tin and lead, is welded to each of the lands 15.

Figure 5:
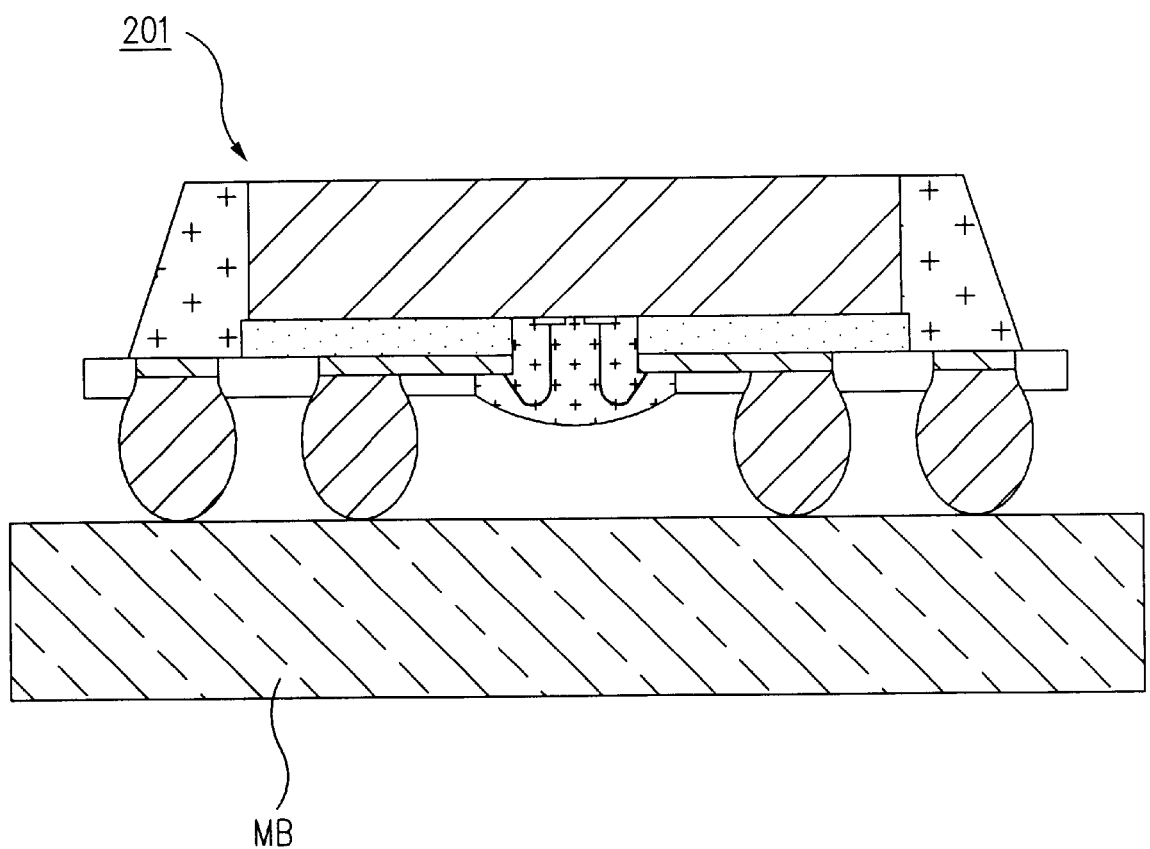
FIG. 5 is a sectional view, showing the first one of the semiconductor devices according to the primary embodiment of the invention mounted on a mother board.

A semiconductor device of this invention is mounted on a mother board MB, with the solder balls being directed and mounted to the mother board MB as shown in FIG. 5.

FIGS. 3a to 3d show semiconductor devices 301, 302, 303 and 304 in accordance with four different examples of the second embodiment of this invention. In the second embodiment, the general shape of a semiconductor device remains the same as that described for the primary embodiment.

As shown in the drawings, any one of the semiconductor devices according to the second embodiment comprises a semiconductor chip 40. The above chip 40 has a plurality of signal input/output pads or edge pads 41 on opposite edges of one surface or the upper surface thereof.

An adhesive layer 21 is provided on the pad-carrying surface or the upper surface of the chip 40, with the area of the adhesive layer 21 being smaller than that of the chip 40. A substrate 10 is attached to the upper surface of the adhesive layer 21. A plurality of first circuit patterns are formed on the substrate 10 at a position corresponding to the upper surface of the chip 40. one or more first holes 22 are formed along the opposite edges of the substrate 10 at positions outside the first circuit patterns and corresponding to the pads 41 of the chip 40. A plurality of second circuit patterns are formed on the substrate 10 at a position outside both the first holes 22 and the edge of the chip 40. Each of the first and second circuit patterns comprises a bond finger 13, a connector 14 and a solder ball land 15. In addition, both a bond finger opening area 19 and a solder ball land opening area 18 are formed on each of the first and second circuit patterns. The first and second circuit patterns are also coated with a cover coat 16, thus being protected from the atmospheric environment.

The substrate 10 has one or more second holes 17 at positions corresponding to the first holes 22 of the adhesive layer 21 or the signal input/output pads 41 of the chip 40. The signal input/output pads 41 of the chip 40 are electrically connected to the first and second circuit patterns or the bond fingers 13 of the substrate 10 using an electric connecting means 50 passing through the second holes 17 of the substrate 10. In the present invention, it is preferable to use a conductive wire or a lead as the electric connecting means 50.

A primary packaging part 60 is formed on the electric connection part, comprising the connecting means 50 and the signal input/output pads 41, along the opposite edges of the chip 40 or in the second hole 17 of the substrate 10, thus protecting the electric connection part from the atmospheric environment. In such a case, it is preferable to form the primary packaging part 60 using a liquid encapsulant packaging material.

In addition to the primary packaging part 60, a second packaging part 61 is formed on an area defined between the sidewall of the chip 40 and the lower surface of the portion of the substrate 10 having the second circuit patterns outside the second holes 17 or the opposite edges of the chip 40. Therefore, the portion of the substrate 10, having the second circuit patterns, is supported by the second packaging part 61, thus being prevented from being bent. In the present invention, it is preferable to form the second packaging part 61 using an epoxy molding compound.

In the second embodiment, the primary packaging part 60 passes through the second holes 17 of the substrate 10 prior to being directly integrated with the second packaging part 61. The primary packaging part 60 is preferably formed using a dispenser, while the second packaging part 61 is preferably formed using a mold.

Figure 3A:
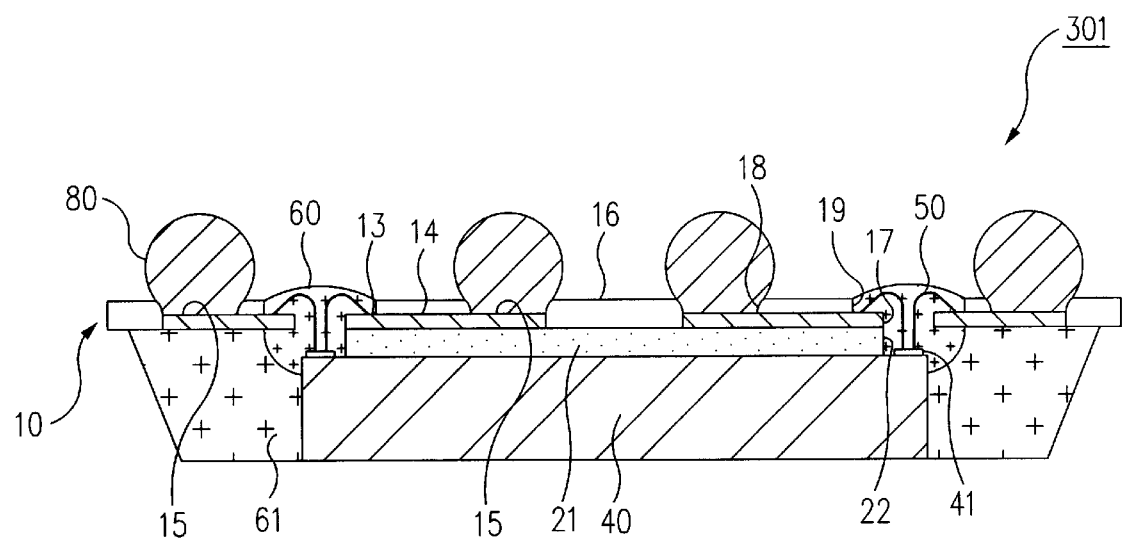
FIGS. 3a to 3d are sectional views, respectively showing semiconductor devices in accordance with four different examples of the second embodiment of this invention.
Figure 3B:
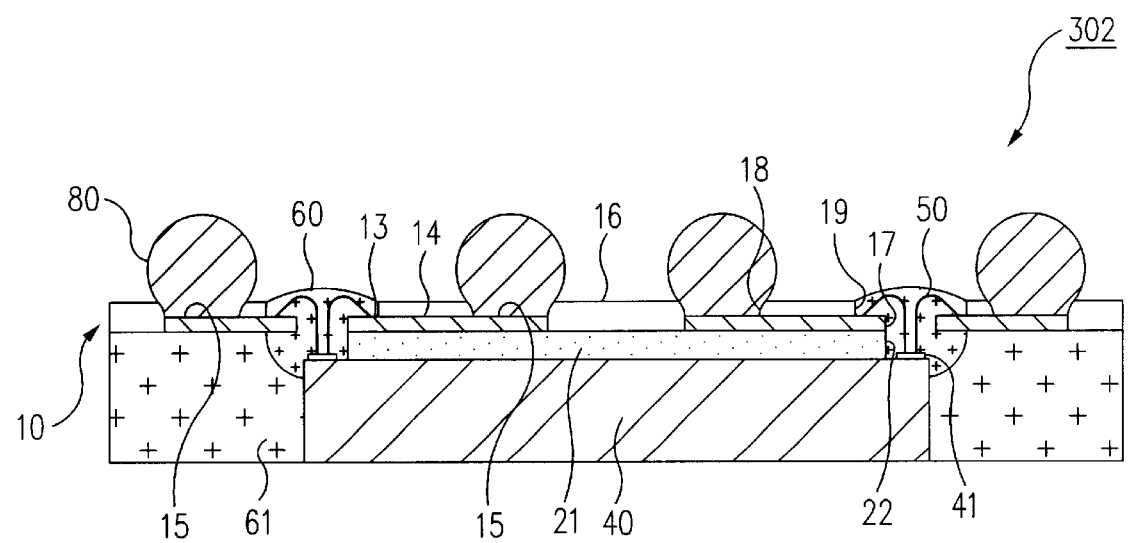
Figure 3C:
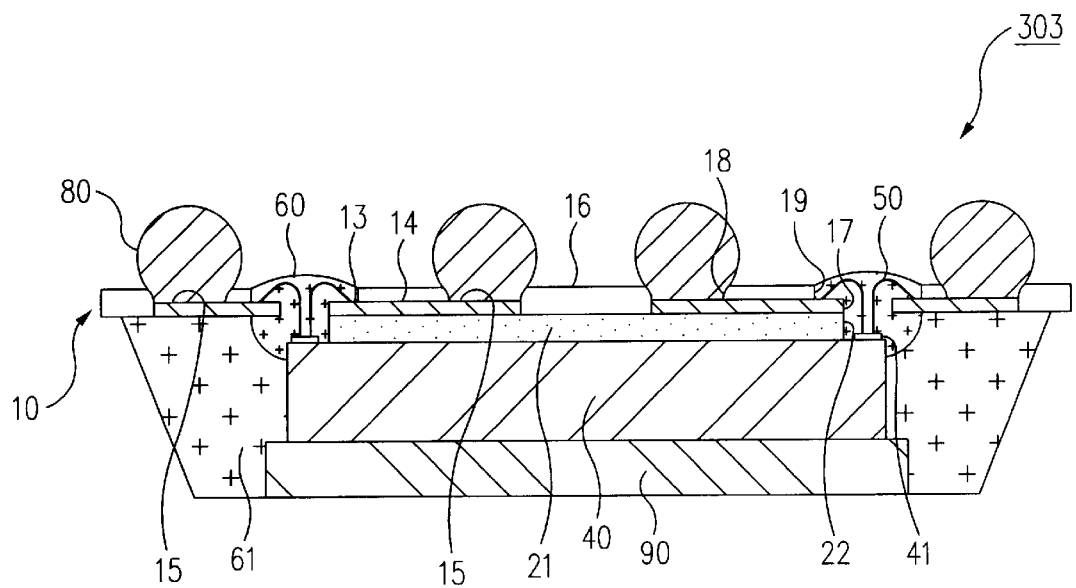

The sidewall of the second packaging part 61 may be positioned inside the edge of the substrate 10, having the second circuit patterns, and may extend while being inclined downwardly relative to the sidewall of the chip 40 at an acute angle as shown in FIGS. 3a and 3c. Alternatively, the sidewall of the second packaging part 61 may be positioned to be aligned with the edge of the substrate 10, having the second circuit patterns, and may extend in parallel to the sidewall of the chip 40 as shown in FIGS. 3b and 3d.

In addition, the lower surface of the chip 40, or the surface opposite to the pad carrying surface of the chip 40, may be preferably leveled with the lower surface of the second packaging part 61, or the surface opposite to the substrate contact surface of the part 61. In such a case, the lower surface of the chip 40 is totally exposed to the atmosphere, thus allowing the chip 40 to more effectively and quickly dissipate heat into the atmosphere during an operation of the semiconductor device.

Figure 3D:
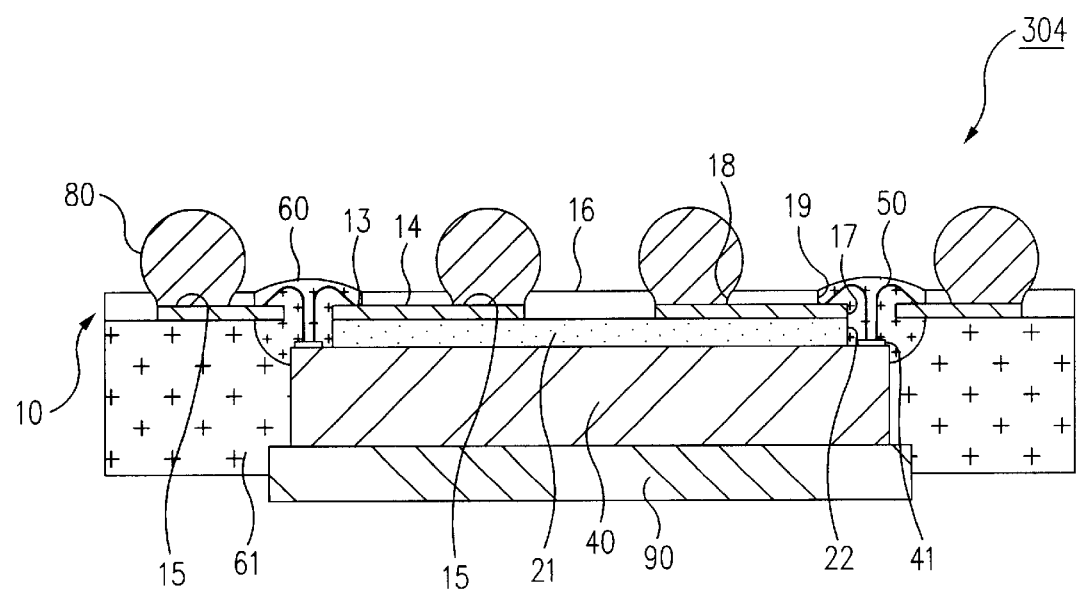

In order to further improve the heat dissipating effect of the semiconductor device, a heat dissipating plate 90 may be attached to the lower surface of the chip 40, or the surface opposite to the pad carrying surface of the chip 40, as in FIGS. 3c and 3d.

In such a case, it is preferable to cover the sidewall of the heat dissipating plate 90 with the second packaging. part 61 so as to allow the plate 90 to be firmly interlocked by the second packaging part 61.

On the other hand, the lower surface of the heat dissipating plate 90, or the surface opposite to the chip contact surface of the plate 90, may be preferably leveled with the lower surface of the second packaging part 61, or the surface opposite to the substrate contact surface of the part 61. In such a case, the lower surface of the heat dissipating plate 90 is totally exposed to the atmosphere.

A solder ball 80 is welded to each of the solder ball lands 15 of the first and second circuit patterns formed on the substrate 10.

As described above, in a semiconductor device 201, 202, 203, 204, 301, 302, 303, or 304 in accordance with the primary or second embodiment of the present invention, the substrate 10 is positioned on the semiconductor chip 40 and extends so as to exceed the edge of the chip 40, thus having an enlarged support area capable of carrying an increased number of circuit patterns and an increased number of solder balls.

In addition, a second packaging part 61 is formed on an area defined between the sidewall of the semiconductor chip 40 and the lower surface of the portion of the substrate 10, extending so as to exceed the edge of the chip 40. Therefore, the portion of the substrate 10, exceeding the edge of the chip 40, is firmly supported by the second packaging part 61, thus being prevented from being bent. The second packaging part 61 also firmly supports the solder balls 80 welded to the substrate 10.

The lower surface of the chip 40 is directly exposed to the atmosphere or is provided with a heat dissipating plate 90. Therefore, the chip 40 more effectively and quickly dissipates heat into the atmosphere during an operation of the semiconductor device, thus being almost free from a reduction in its electric performance or an operational error.

The above-mentioned semiconductor devices of this invention are produced as follows.

In order to produce the semiconductor device, a semiconductor chip bonding step is primarily performed. In the chip bonding step, a semiconductor chip 40, having a plurality of signal input/output pads 41, is attached to the lower surface of a substrate 10 using an adhesive layer 21. In such a case, the substrate 10 has an area larger than that of the chip 40, and is provided with one or more holes 17 at positions corresponding to the pads 41 of the chip 40, with a plurality of circuit patterns being formed on the substrate 10 at a position outside the holes 17 and being covered with a cover coat 16 so as to be protected by the coat 16.

In such a case, each of the circuit patterns may comprise a bond finger 13, a connector 14 and a solder ball land 15. The bond fingers 13 of the circuit patterns may be preferably plated with silver (Ag) capable of accomplishing an effective electric connection between the bond fingers 13 and electric connecting means 50. In the same manner, the solder ball lands 15 may be preferably plated with gold (Au), nickel (Ni) or palladium (Pd) capable of allowing a solder ball 80 to be effectively and firmly welded to each solder ball land 15.

In addition, it is preferable to use a double-faced adhesive tape or an epoxy adhesive material as the adhesive layer 21 used for bonding the chip 40 to the lower surface of the substrate 10.

Since the semiconductor chip 40 has the pads 41 on its upper surface, the pads 41 are positioned in the lower portion inside the holes 17 of the substrate 10 when the chip 40 is completely attached to the lower surface of the substrate 10 as described above.

After the chip bonding step is accomplished, an electric connection step is performed. In the electric connection step, each signal input/output pad 41 of the semiconductor chip 40 is electrically connected to an associated circuit pattern or an associated bond finger 13 of the substrate 10 using an electric connecting means 50, such as a conductive wire or a lead.

Thereafter, a primary packaging step is performed so as to form a primary packaging part 60 in the second holes 17 of the substrate 10 using a packaging material, preferably, a liquid packaging material. The above primary packaging part 60 protects the electric connection part of the device, comprising the signal input/output pads 41 of the chip 40 and the conductive wires 50, from the atmospheric environment, such as dust, moisture and mechanical impact.

In order to form the primary packaging part 60, it is preferable to dispense a liquid packaging material using a dispenser. Such a liquid packaging material, maintaining a liquid phase at room temperature as long as it is not exposed to air, is hardened when it is exposed to air. Therefore, when the liquid packaging material is applied into the holes 17 of the substrate 10 using a dispenser in the same manner as that of a conventional tube of tooth paste, the packaging material completely covers both the conductive wires 50 and the signal input/output pads 41 of the chip 40 prior to being gradually hardened.

After the primary packaging step, a second packaging step is performed so as to form a second packaging part 61. In the second packaging step, the second packaging part 61 is formed on an area, defined between the sidewall of the chip 40 and the lower surface of the portion of the substrate 10 extending outside the edge of the chip 40, using a packaging material, preferably, an epoxy molding compound. In such a case, it is preferable to form the second packaging part 61 by injecting high pressure and high temperature epoxy molding compound to a desired area of a semiconductor device held in a mold.

When a mold, with a cavity having a trapezoidal cross-section, is used in the second packaging step, it is possible to form a trapezoidal second packaging part 61 as shown in FIG. 2a, 2c, 3a, or 3c. Alternatively, the second packaging part 61 may have a rectangular cross-section as shown in FIG. 2b, 2d, 3b, or 3d. In such a case, the second packaging part 61 is formed on the total area, defined between the sidewall of the chip 40 and the lower surface of the portion of the substrate 10 extending outside the edge of the chip 40, using an epoxy molding compound. Thereafter, the second packaging part 61 is subjected to a sawing process, thus having a desired rectangular cross-section. In the second packaging step, it is preferable to allow the lower surface of the second packaging part 61 to be completely leveled with the lower surface of the chip 40, thus exposing the lower surface of the chip 40 to the atmosphere. This allows the chip 40 to more effectively and quickly dissipate heat into the atmosphere during an operation of the device.

In order to further improve the heat dissipating effect of the semiconductor device, a heat dissipating plate 90 may be attached to the lower surface of the chip 40 as shown in FIG. 2c, 2d, 3c, or 3d. In such a case, the attaching of the heat dissipating plate 90 to the lower surface of the chip 40 may be preferably accomplished by secondarily packaging the device with the plate 90 being positioned on the lower surface of the chip 40. The heat dissipating plate 90 dissipates heat from the chip 40 into the atmosphere during an operation of the device, thus improving the heat dissipating effect of the device.

When the device is provided with such a heat dissipating plate 90, it is also preferable to interlock the sidewall of the plate 90 using the second packaging part 61. In such a case, the plate 90 is almost completely free from an unexpected removal from the lower surface of the chip 40. In addition, the lower surface of the second packaging part 61 is preferably leveled with the lower surface of the chip 40 or is preferably aligned with a position of the sidewall of the chip 40.

After the second packaging step is accomplished, a solder ball welding step is performed so as to weld a solder ball 80 to each of the solder ball lands 15 of the substrate 10. The solder ball welding step may be performed through the following process. That is, a viscous flux is primarily placed onto each solder ball land 15 of the substrate 10 through a dotting process. Thereafter, a solder ball 80 is seated on each solder ball land 15 prior to being heated in a high temperature furnace. In the furnace, the viscous flux volatilizes while melting and welding the solder balls 80 to the lands 15.

As described above, the present invention provides a semiconductor device and a method of manufacturing such a device. In the semiconductor device of this invention, a substrate, having an area larger than that of a semiconductor chip, is bonded to one surface of the chip and extends so as to exceed the edge of the chip, thus carrying an increased number of circuit patterns and an increased number of solder balls.

In addition, a second packaging part is formed on an area defined between the sidewall of the semiconductor chip and the lower surface of the substrate exceeding the edge of the chip. The portion of the substrate, exceeding the edge of the chip, is thus firmly supported by the second packaging part and is prevented from being bent. The second packaging part also firmly supports the solder balls welded to the upper surface of the substrate.

The semiconductor device of this invention is also designed to dissipate heat from the semiconductor chip into the atmosphere through the lower surface of the chip or through a heat dissipating plate mounted to the lower surface of the chip. Therefore, the semiconductor device is almost completely free from a reduction in the electric performance of the chip or an operational error of the chip during an operation.

Although the preferred embodiments of the present invention have been disclosed for illustrative purposes, those skilled in the art will appreciate that various modifications, additions and substitutions are possible, without departing from the scope and spirit. of the invention as disclosed in the accompanying claims.

What is claimed is:

1. A semiconductor package comprising:
   a semiconductor chip having a first surface and peripheral sidewalls, wherein the first surface has a plurality of conductive pads;
   a substrate having a first surface, an opposite second surface, one or more first openings between the first and second surfaces, a layer of metallizations, and a layer of a hardened insulative material at the second surface of the substrate covering said metallizations,
   wherein the chip is mounted adjacent to the first surface of the substrate such that one or more peripheral portions of the substrate extend beyond an adjacent sidewall of the chip and the pads are each juxtaposed with a respective one of the first openings;
   an adhesive layer between the first surface of the substrate and the first surface of the chip, wherein a perimeter of the adhesive layer is approximately coplanar with said sidewall of the chip;

a plurality of conductors, wherein each conductor is between a respective one of the pads and a respective one of the metallizations and extends through a first opening;

a hardened first packaging material in said one or more first openings, said first packaging material covering the pads and conductors;

a hardened second packaging material between and contacting the one or more peripheral portions of the first surface of the substrate and the adjacent sidewall of the chip, said hardened second material contacting said first surface of the substrate outside of the perimeter of the adhesive layer; and a plurality of solder balls each connected to a respective one of the metallizations through the insulative layer.

2. The package of claim 1, wherein said substrate comprises a flexible layer positioned between said metallizations and said adhesive layer.

3. The package of claim 2, wherein said flexible layer is a polyimide layer; and said substrate comprises a metal layer positioned between the polyimide layer and the adhesive layer.

4. The package of claim 1, wherein said first packaging material is a hardened liquid encapsulant material.

5. The package of claim 1, wherein the second packaging material is a hardened molded epoxy material.

6. The package of claim 1, wherein the one or more peripheral portions of the fist surface of the substrate have an outer edge, and a first sidewall of said hardened second packaging material extends to said edge.

7. The package of claim 6, wherein the first sidewall of the hardened second packaging material is parallel with the adjacent sidewall of the chip.

8. The package of claim 1, wherein the chip has a second surface opposite the frt surface of the chip;
the hardened second packaging material has a first surface on said first surface of the substrate and an opposite second surface; and
the second surface of the hardened second packaging material is level with the second surface of the chip.

9. The package of claim 1, wherein said pads are arranged on a central portion of the chip.

10. The package of claim 9, wherein a plurality of the solder balls overhang the peripheral sidewalls of the semiconductor chip.

11. The package of claim 1, wherein the layer of metallizations comprises a first set of metallizations and a second set of metallizations, and the first and second sets of metallizations are on opposite sides of said one or more first openings.

12. The package of claim 1, wherein said conductors are bond wires or leads.

13. A semiconductor package comprising:
a semiconductor chip having a first surface and peripheral sidewalls, wherein the first surface has a plurality of conductive pads;
a substrate having a first surface, an opposite second surface, one or more first openings between the first and second surfaces, a layer of metallizations, and a layer of a hardened insulative material at the second surface of the substrate covering said metallizations,
wherein the chip is mounted adjacent to the first surface of the substrate such that one or more peripheral portions of the substrate extend beyond an adjacent sidewall of the chip and the pads are each juxtaposed with a respective one of the first openings;

an adhesive layer between the first surface of the substrate and the first surface of the chip, wherein a perimeter of the adhesive layer is greater than a perimeter of the chip and smaller than a perimeter of the substrate;

a plurality of conductors, wherein each conductor is between a respective one of the pads and a respective one of the metallizations and extends through a first opening;

a hardened first packaging material in said one or more first openings, said first packaging material covering the pads and conductors; and a hardened second packaging material between and contacting the one or more peripheral portions of the first surface of the substrate and the adjacent sidewall of the chip, said hardened second material contacting said first surface of the substrate outside the perimeter of the adhesive layer.

14. The package of claim 13, wherein said substrate comprises a flexible layer positioned between said metallizations and said adhesive layer.

15. The package of claim 14, wherein said flexible layer is a polyimide layer and said substrate comprises a metal layer positioned between the polyimide layer and the adhesive layer.

16. A semiconductor package comprising:
a semiconductor chip having a first surface and peripheral sidewalls, wherein the first surface has a plurality of conductive pads;
a substrate having a first surface, an opposite second surface, one or more first openings between the first and second surfaces, a layer of metallizations, and a layer of a hardened insulative material at the second surface of the substrate covering said metallizations,
wherein the chip is mounted adjacent to the first surface of the substrate such that one or more peripheral portions of the substrate extend beyond an adjacent sidewall of the chip and the pads are each juxtaposed with a respective one of the first openings;

an adhesive layer having a first surface against the first surface of the substrate and second surface against the first surface of the chip, wherein a perimeter of the adhesive layer is greater than a perimeter of the chip and smaller than a perimeter of the substrate;

a plurality of conductors, wherein each conductor is between a respective one of the pads and a respective one of the metallizations and extends through a first opening;

a hardened first packaging material in said one or more first openings, said first packaging material covering the pads and conductors; and a hardened second packaging material between and contacting the one or more peripheral portions of the first surface of the substrate, the adjacent sidewall of the chip and said second surface of said adhesive layer.

17. The package of claim 16, wherein said substrate comprises a flexible layer positioned between said metallizations, and said adhesive layer.

18. The package of claim 17, wherein said flexible layer is a polyimide layer; and said substrate comprises a metal layer positioned between the polyimide layer and the adhesive layer.

* * * * *